United States Patent [19]
Aoki

[11] Patent Number: 5,303,397
[45] Date of Patent: Apr. 12, 1994

[54] SEMICONDUCTOR INTEGRATED CIRCUIT CONTAINING A CIRCUIT HAVING AN IMPEDANCE CIRCUIT EXTERNALLY ATTACHED THERETO

[75] Inventor: Hidehiko Aoki, Yokohama, Japan

[73] Assignee: Kabushiki Kaisha Toshiba, kawasaki, Japan

[21] Appl. No.: 738,440

[22] Filed: Jul. 31, 1991

[30] Foreign Application Priority Data

Aug. 1, 1990 [JP] Japan ................... 2-204540

[51] Int. Cl.⁵ .............................. H04B 17/02
[52] U.S. Cl. ..................... 455/142; 455/144; 360/68; 307/491; 381/123
[58] Field of Search ............. 455/142, 143, 144; 360/68; 330/289; 307/491; 381/11-12, 123

[56] References Cited

U.S. PATENT DOCUMENTS

| | | | |
|---|---|---|---|
| 4,201,946 | 5/1980 | McFayden | 455/143 |
| 4,423,442 | 12/1983 | Bitting et al. | 360/68 |
| 4,453,135 | 6/1984 | Mattfeld et al. | 455/142 |

FOREIGN PATENT DOCUMENTS

| | | |
|---|---|---|
| 3223348 | 1/1984 | Fed. Rep. of Germany . |
| 0160144 | 12/1981 | Japan .................. 455/142 |
| 60-103817 | 11/1983 | Japan . |
| 61-182308 | 8/1986 | Japan . |
| 2101826 | 1/1983 | United Kingdom . |
| 2113032 | 7/1983 | United Kingdom . |

OTHER PUBLICATIONS

"An AM/FM Radio Subsystem IC" *IEEE Transactions*, May 1977; Blaser et al; pp. 129-135.
Toshiba General Audio IC Data Book '90; pp. 321-329, TA8189N.

Primary Examiner—Reinhard J. Eisenzopf
Assistant Examiner—Andrew Faile
Attorney, Agent, or Firm—Oblon, Spivak, McClelland, Maier & Neustadt

[57] ABSTRACT

A semiconductor integrated circuit includes a first circuit and a second circuit. The first circuit is set into an operative state in a first mode and into a non-operative state in a second mode, and the transfer characteristic thereof depends on an externally attached impedance circuit. The second circuit is set into an operative state in the second mode and into a non-operative state in the first mode. A resistor is externally connected to the second circuit. A third circuit for keeping a voltage applied across the resistor constant and deriving a current flowing in the resistor in the first mode irrespective of the presence or absence and the magnitude of a voltage applied to one end of the resistor is provided in the first circuit. The resistor is commonly used by the first circuit and the second circuit.

8 Claims, 5 Drawing Sheets

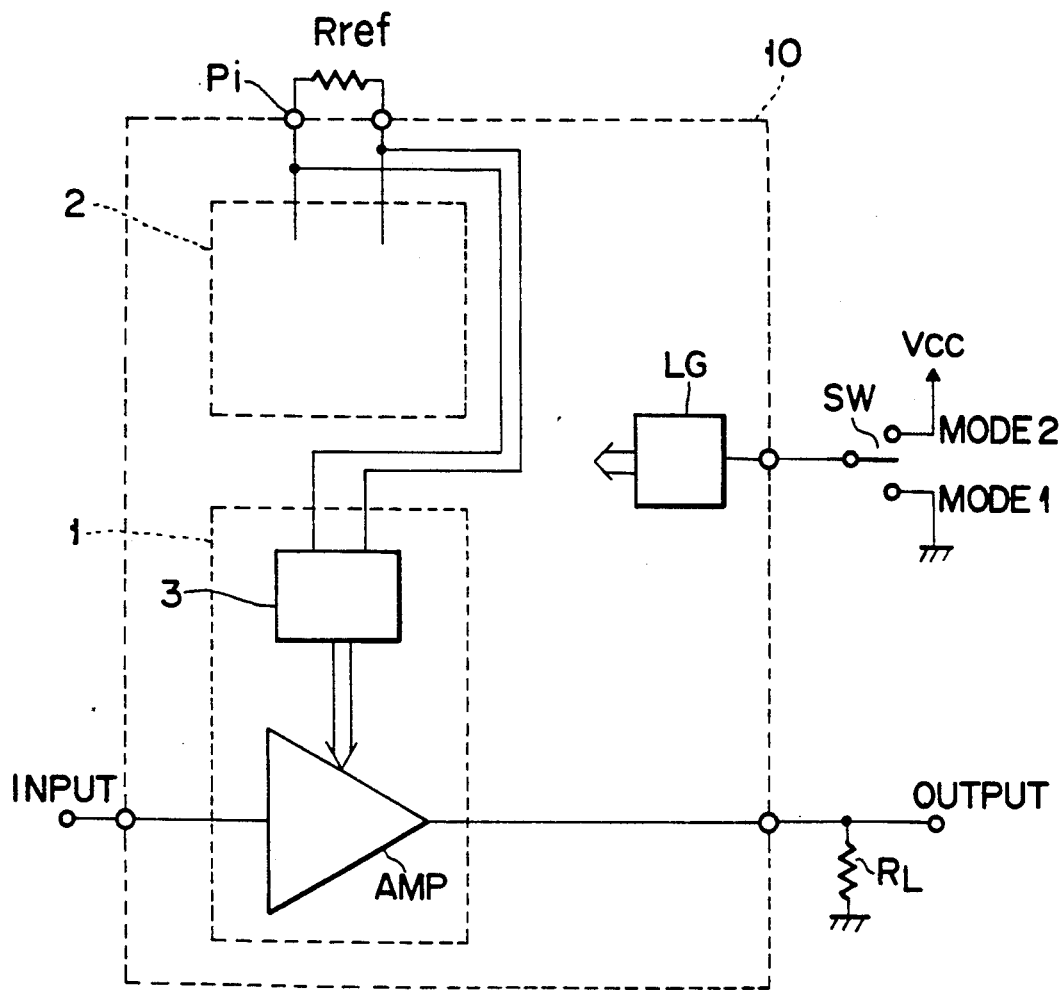
F I G. 3

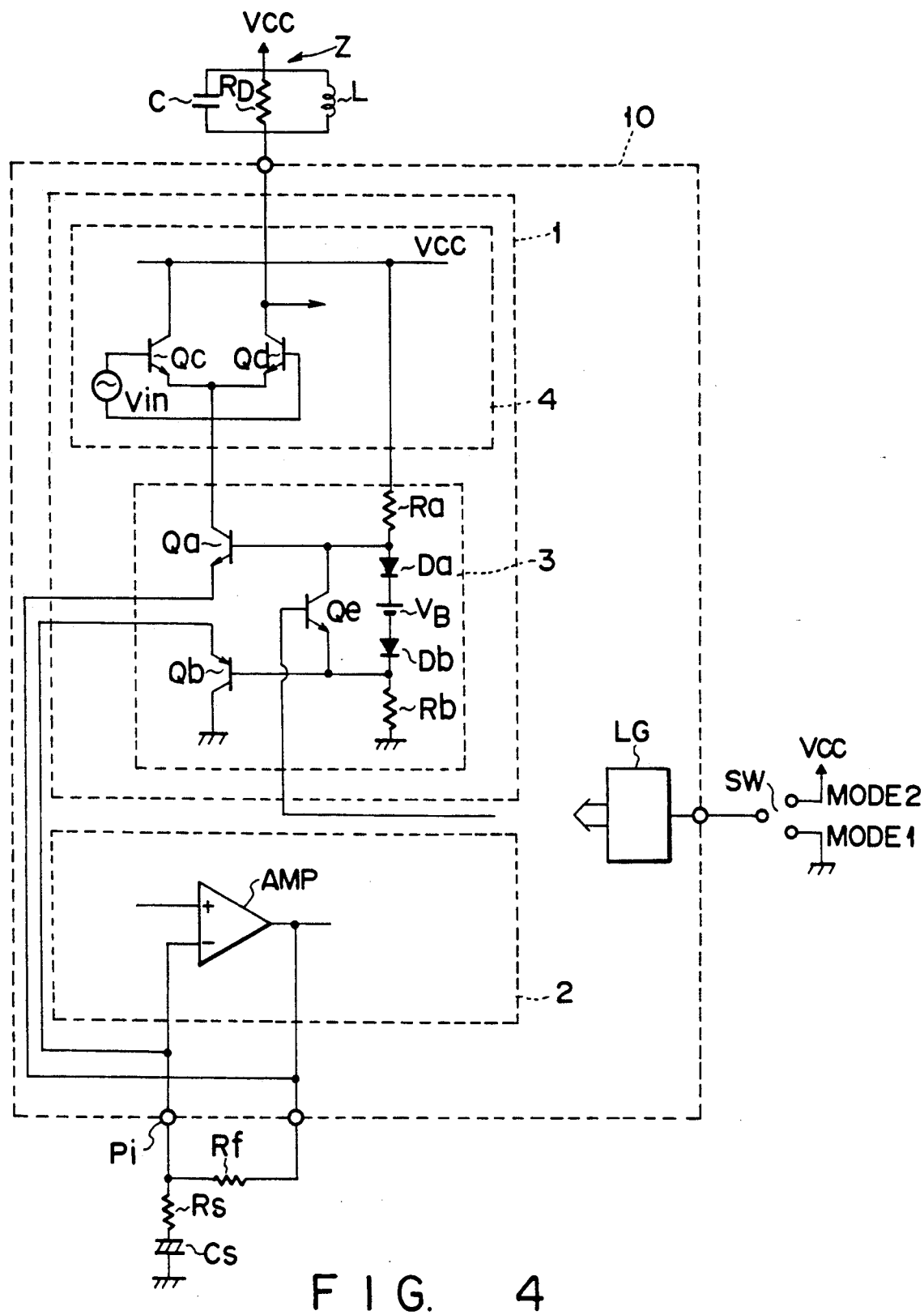
F I G. 4

SEMICONDUCTOR INTEGRATED CIRCUIT CONTAINING A CIRCUIT HAVING AN IMPEDANCE CIRCUIT EXTERNALLY ATTACHED THERETO

BACKGROUND OF THE INVENTION

1. Field of the Invention

This invention relates to a semiconductor integrated circuit, and more particularly to a semiconductor integrated circuit containing a circuit having an impedance circuit externally attached thereto, for example, an amplifier circuit having a load resistor provided outside a chip or a time constant circuit having a capacitor provided outside a chip.

2. Description of the Related Art

FIG. 1 shows a block construction of an integrated circuit containing an amplifier circuit AMP having a load resistor $R_L$ externally attached thereto. A portion surrounded by broken lines is an internal portion of the integrated circuit 10, and in the integrated circuit 10, a current source circuit CS for creating an operation current of the amplifier circuit AMP and a reference resistor Rref for determining the value of the current created by the current source circuit CS are provided.

In most cases, the gain $G_V$ of the amplifier circuit AMP varies in proportion to the product of the current generated by the circuit CS and the resistance of the load resistor $R_L$, although the variation in the gain may also depend on the circuit construction. Since the current created by the current source circuit CS varies in inverse proportion to the resistance of the reference resistor Rref, the gain $G_V$ varies in proportion to the resistance of the load resistor $R_L$ and varies in inverse proportion to the resistance of the reference resistor Rref. This relation can be expressed by the following equation:

$$G_V = K \cdot (R_L \cdot Rref) \quad (1)$$

where K is a constant.

In a case where the amplifier circuit AMP is a feedback amplifier circuit, the gain $G_V$ does not vary in proportion to the resistance of the load resistor $R_L$, but the above equation (1) can be applied by taking an open loop gain into consideration.

Based on the above fact, it can be said that the gain $G_V$ varies in proportion to the resistance of a resistor provided outside the integrated circuit (chip) 10 and varies in inverse proportion to the resistance of a resistor provided inside the integrated circuit 10.

When variations in the resistances of the respective resistors are taken into consideration, the degrees of variations in the resistances of the load resistor $R_L$ and reference resistor Rref, and particularly, the degree of variation in the resistance of the reference resistor Rref in the integrated circuit 10 is larger than that in the resistance of the externally connected load resistor $R_L$. Typically, the degree of variation in the resistance of the load resistor $R_L$ is ±5% and the degree of variation in the resistance of the reference resistor Rref is ±20%. These values can be reduced to less than 1% by using a high-precision resistor for the load resistor $R_L$ and by using a manufacturing method such as laser trimming for forming the reference resistor Rref. However, in this case, the cost will become extremely high.

Further, when the temperature characteristics of the respective resistors are taken into consideration, the temperature coefficients of the load resistor $R_L$ and the reference resistor Rref are different from each other and therefore the gain $G_V$ will be changed with a temperature variation. The load resistors $R_L$ of various temperature coefficients are available, but when it is required to use a load resistor $R_L$ of specified temperature coefficient, it may be different from a standard resistor and the cost thereof will become high. Further, since the temperature coefficient of the reference resistor Rref is determined by the manufacturing process of the circuit, it is practically impossible to change the temperature coefficient of the reference resistor Rref.

That is, with the circuit construction shown in FIG. 1, variation in the gain $G_V$ of the amplifier circuit AMP is large and the gain $G_V$ is also influenced by temperature variation so that it cannot be used in practice.

The circuit construction for solving the above problem is shown in FIG. 2. The difference between the constructions of FIGS. 1 and 2 lies in that the reference resistor Rref is provided outside the integrated circuit (chip) 10. With this construction, the problem of the circuit construction shown in FIG. 1 can be solved, but since the reference resistor Rref is externally connected, the number of external pins of the integrated circuit 10 must be increased by 2 in comparison with the case of FIG. 1. Even if one of the external pins which are connected to the reference resistor Rref is commonly used with a ground pin or the like, one pin must be additionally provided. Further, since the reference resistor Rref is externally connected, the number of externally attached parts is increased.

SUMMARY OF THE INVENTION

Accordingly, an object of this invention is to provide a semiconductor integrated circuit in which influence on the transfer characteristic by temperature variation and variation in resistances of resistors provided in an integrated circuit can be suppressed to minimum without increasing the number of external pins and externally attached resistors.

The above object can be attained by a semiconductor integrated circuit comprising a first circuit which is set into an operative state in a first mode and into a nonoperative state in a second mode and whose transfer characteristic is dependent on an impedance circuit externally attached to a chip; a second circuit set into an operative state in the second mode and into a non-operative state in the first mode; a resistor externally attached to the chip so as to be connected to the second circuit; and a third circuit contained in the first circuit, for keeping a voltage applied across the resistor constant and deriving a current flowing in the resistor in the first mode irrespective of the presence or absence and the magnitude of a voltage applied to one end of the resistor.

With the above construction, an operation current in the first circuit set in the operative state in the first mode can be created by the third circuit based on the resistor externally connected to the second circuit set in the non-operative state and can be supplied to the first circuit.

Therefore, since the resistor externally connected to the second circuit can be commonly used by the first and second circuits, influence on the transfer characteristic by temperature variation and variation in resistances of the resistors provided in the integrated circuit can be eliminated without increasing the number of external pins and externally attached resistors.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a block diagram for illustrating a semiconductor integrated circuit according to a first embodiment of this invention and shows the construction of part of the integrated circuit containing an amplifier circuit having a load resistor externally connected thereto;

FIG. 4 is a block diagram for illustrating a semiconductor integrated circuit according to a second embodiment of this invention and shows the construction of part of the integrated circuit containing a peaking circuit having a load resistor externally connected thereto;

DETAILED DESCRIPTION OF THE PREFERRED EMBODIMENTS

Figure 1:
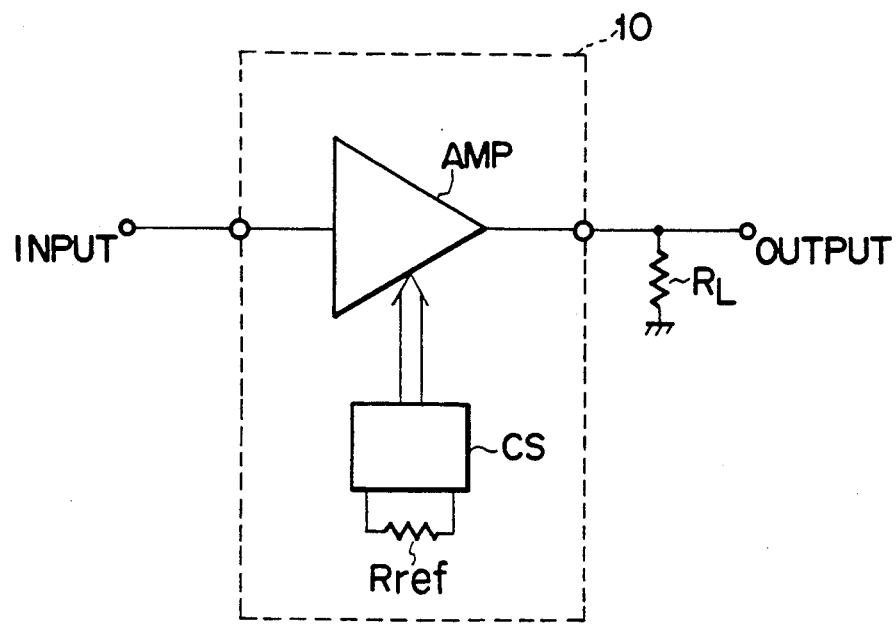
FIGS. 1 and 2 are block diagrams showing conventional semiconductor integrated circuits.
Figure 2:
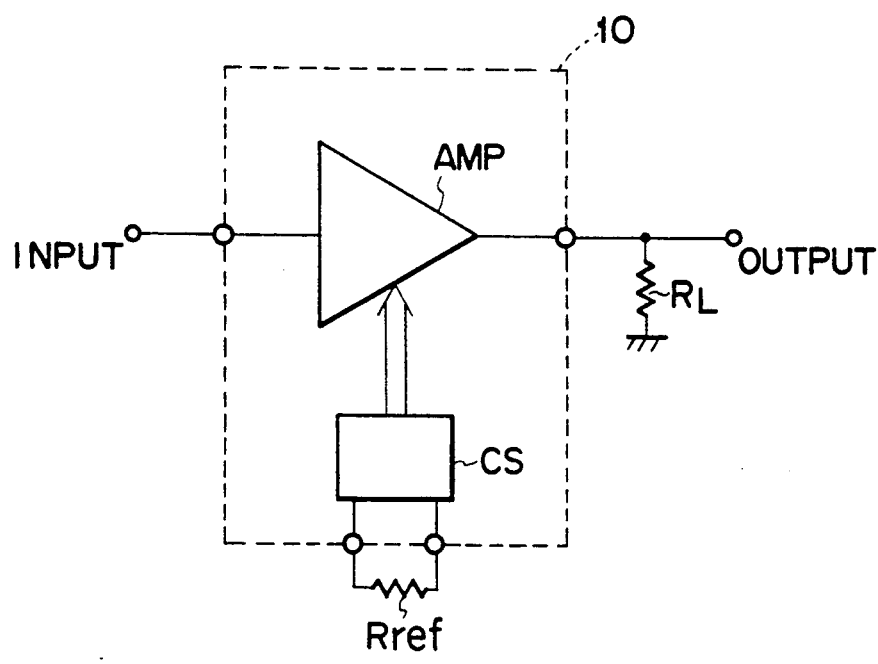

FIG. 3 shows the block construction of part of an integrated circuit containing an amplifier circuit AMP having a load resistor $R_L$ externally connected thereto. The integrated circuit 10 includes a first circuit 1 which is set into an operative state in a first mode (mode 1) and into a non-operative state in a second mode (mode 2) and whose transfer characteristic is dependent on an impedance circuit externally attached to a chip and a second circuit 2 set into an operative state in the second mode and into a non-operative state in the first mode. The first circuit 1 includes the amplifier circuit AMP and a third circuit 3. The third circuit 3 keeps constant a voltage applied across a resistor (in this example, a reference resistor Rref) and deriving a current flowing in the reference resistor Rref to supply the same to the amplifier circuit AMP in the first mode irrespective of the presence or absence and the magnitude of a voltage applied to one end of the reference resistor Rref. A logic circuit LG controls the operation mode of the integrated circuit 10 so as to set the integrated circuit 10 into the mode 1 or mode 2 according to the switch position of a switch SW externally attached to the integrated circuit 10. A resistor $R_L$ is a load resistor of the amplifier circuit AMP and corresponds to an impedance circuit externally attached to the chip.

In FIG. 3, the ground pin and power source pin necessary for operation of the integrated circuit 10 are omitted for clarifying the drawing.

In the circuit shown in FIG. 3, since the gain $G_V$ of the amplifier circuit AMP varies in proportion to the product of a current generated in the third circuit 3 and the resistance of the load resistor $R_L$ in the same manner as in the conventional case and the current generated in the third circuit 3 varies in inverse proportion to the resistance of the reference resistor Rref, the gain $G_V$ can be expressed by the following equation.

$$G_V = K \cdot (R_L \cdot Rref) \qquad (2)$$

where K is a constant but is not necessarily set to be equal to K used in the equation (1).

In the above equation (2), since the reference resistor Rref and load resistor $R_L$ are externally connected resistors, the error of the resistance of the resistors can be suppressed within ±5%. Further, since the temperature coefficients thereof can be regarded as being substantially equal to each other, variation in the gain $G_V$ due to temperature variation will not occur. The reference resistor Rref is a resistor which is essentially required by the second circuit in the mode 2 and is not newly provided. Therefore, the number of external pins of the integrated circuit 10 and the number of externally attached resistors are not increased.

The circuit shown in FIG. 3 may be used as an integrated circuit applied for a magnetic recording and reproducing device, for example. In this case, it can be assumed that the first circuit is a recording-side amplifier circuit, the second circuit is a reproducing-side amplifier circuit, the mode 1 is a recording mode, the mode 2 is a reproducing mode, and the reference resistor Rref is a feedback resistor used in the reproducing-side amplifier circuit. It is also possible to consider that the first circuit is a reproducing-side amplifier circuit, the second circuit is a recording-side amplifier circuit, the mode 1 is a reproducing mode, the mode 2 is a recording mode, and the reference resistor Rref is a feedback resistor used in the recording-side amplifier circuit.

FIG. 4 shows a block construction of part of an integrated circuit containing a peaking circuit having a load resistor externally connected thereto as another embodiment of this invention.

The integrated circuit 10 contains first to fourth circuits 1 to 4 and a logic circuit LG. The logic circuit LG controls the operation mode of the integrated circuit 10 so as to set the integrated circuit 10 into the mode 1 or mode 2 according to the switch position of a switch SW externally attached to the integrated circuit (chip) 10. The first circuit 1 contains the third and fourth circuits 3 and 4 and is set into the operative state in the mode 1. The second circuit 2 contains an amplifier circuit AMP and is set into the operative state in the mode 2. A resistor Rf is externally connected to the second circuit 2. A resistor $R_S$ and capacitor $C_S$ are serially connected between an external pin Pi and the ground terminal. An impedance circuit (which is constituted by connecting a capacitor C, inductor L and resistor $R_D$ in parallel) Z is externally connected to the fourth circuit 4.

The third circuit 3 is used to keep constant a voltage applied across the resistor Rf which is externally connected to the second circuit 2 in the mode 1 and derive a current flowing in the resistor Rf and supply the same to the fourth circuit 4. The third circuit 3 is constituted to include NPN transistors Qa and Qe, PNP transistor Qb, resistors Ra and Rb, diodes Da and Db and DC voltage source $V_B$. The emitter of the transistor Qa is connected to one end of the externally attached resistor Rf. The emitter of the transistor Qb is connected to the other end of the externally attached resistor Rf and the collector thereof is connected to the ground terminal. The resistor Ra is connected between the power source Vcc and the base of the transistor Qa. The diode Da, DC voltage source $V_B$ and diode Db are series-connected between the bases of the transistors Qa and Qb. The resistor Rb is connected between the base of the transistor Qb and the ground terminal. The collector of the transistor Qe is connected to the base of the transistor Qa, the emitter thereof is connected to the base of the transistor Qb and the bas thereof is connected to receive an output signal from the logic circuit LG.

The fourth circuit 4 includes a differential amplifier (transistors Qc and Qd) for amplifying a differential input signal supplied from a signal source Vin. The emitters of the transistors Qc and Qd are commonly connected, and the emitter common connection node is connected to the collector of the transistor Qa. The circuit 4 supplies a current derived by the third circuit 3 to the impedance circuit Z which is a load of the differential amplifier circuit. The impedance circuit Z is combined with the differential amplifier circuit to construct a peaking circuit. The peaking circuit selectively amplifies only a signal having a resonance frequency determined by the capacitance of a capacitor C of the impedance circuit Z and the inductance of an inductor L thereof and attenuates signals of frequencies other than the resonance frequency. A damping resistor $R_D$ connected in parallel with the capacitor C and inductor L functions to determine the gain in the resonance frequency.

The gain $G_V$ of the peaking circuit is expressed by the following equation.

$$G_V = (R_D \cdot Ic(Qa))/(4 \cdot V_T) \quad (3)$$

where $V_T$ is a thermal voltage (V) and Ic(Qa) is a collector current of the transistor Qa and can be expressed as follows:

$$Ic(Qa) = V_B/Rf$$

Therefore, the gain $G_V$ can be rewritten as follows:

$$G_V = (\tfrac{1}{4}) \cdot (R_D/Rf) \cdot (V_B/V_T) \quad (4)$$

Since $V_B$ is a voltage generated by the DC voltage source included in the third circuit 3, and the resistors $R_D$ and Rf are externally attached resistors, if a voltage generated from the DC voltage source dependends on the thermal voltage $V_T$, variation thereof caused by temperature choose is small.

The transistor Qe in the third circuit 3 functions to electrically disconnect the transistors Qa and Qb from the second circuit 2 in order to correctly operate the amplifier circuit AMP in the mode 2. That is, the transistor Qe is controlled by an output signal of the logic circuit LG and set into the ON state in the mode 2. At this time, since the base potential of the transistor Qb is set to $Vcc \times Rb/(Ra+Rb)$, the transistors Qa and Qb are set into the OFF state if the output potential of the amplifier circuit AMP or the potential on the reference input terminal (+) of the amplifier circuit AMP is set to be substantially equal to the base potential of the transistor Qb. However, strictly speaking, the above operation can be effected only in a range in which an output voltage of the amplifier circuit AMP on the low level side is lower than a voltage between the base and emitter of the transistor Qa.

In an integrated circuit, in order to reduce the number of external pins and set the same as small as possible, one external pin is sometimes designed to have a plurality of functions (one external pin is commonly used by a plurality of circuits). The reason why the reference resistor Rref in FIG. 3 or the resistor Rf in FIG. 4 is commonly used by the second and third circuits is to provide a plurality of functions for at least one of the external pins connected to the reference resistor Rref and resistor Rf.

For example, if the integrated circuit of FIG. 3 is used as a compact cassette magnetic recording and reproducing device, the first circuit 1 is a recording-side amplifier circuit. The second circuit 2 is a reproducing-side amplifier circuit, the mode 1 is a recording mode, the mode 2 is a reproducing mode and the reference resistor Rref is a feedback resistor used in the reproducing-side amplifier circuit, then an external pin Pi connected to one end of the reference resistor Rref and the first circuit 1 can also be used as a logic signal input pin for selectively setting the metal/normal mode in the recording mode. Further, if the integrated circuit of FIG. 3 is used as an FM/AM tuner containing a multiplexer, the first circuit 1 is an AM tuner circuit. The second circuit 2 is an FM tuner circuit, the mode 1 is an AM receiving mode, the mode 2 is an FM receiving mode and the reference resistor Rref is an externally attached resistor used in the FM tuner circuit, then an external pin connected to one end of the reference resistor Rref and the first circuit 1 can also be used as a logic signal input pin for selectively setting the stereo/forced monoral mode in the FM receiving mode.

Figure 5:
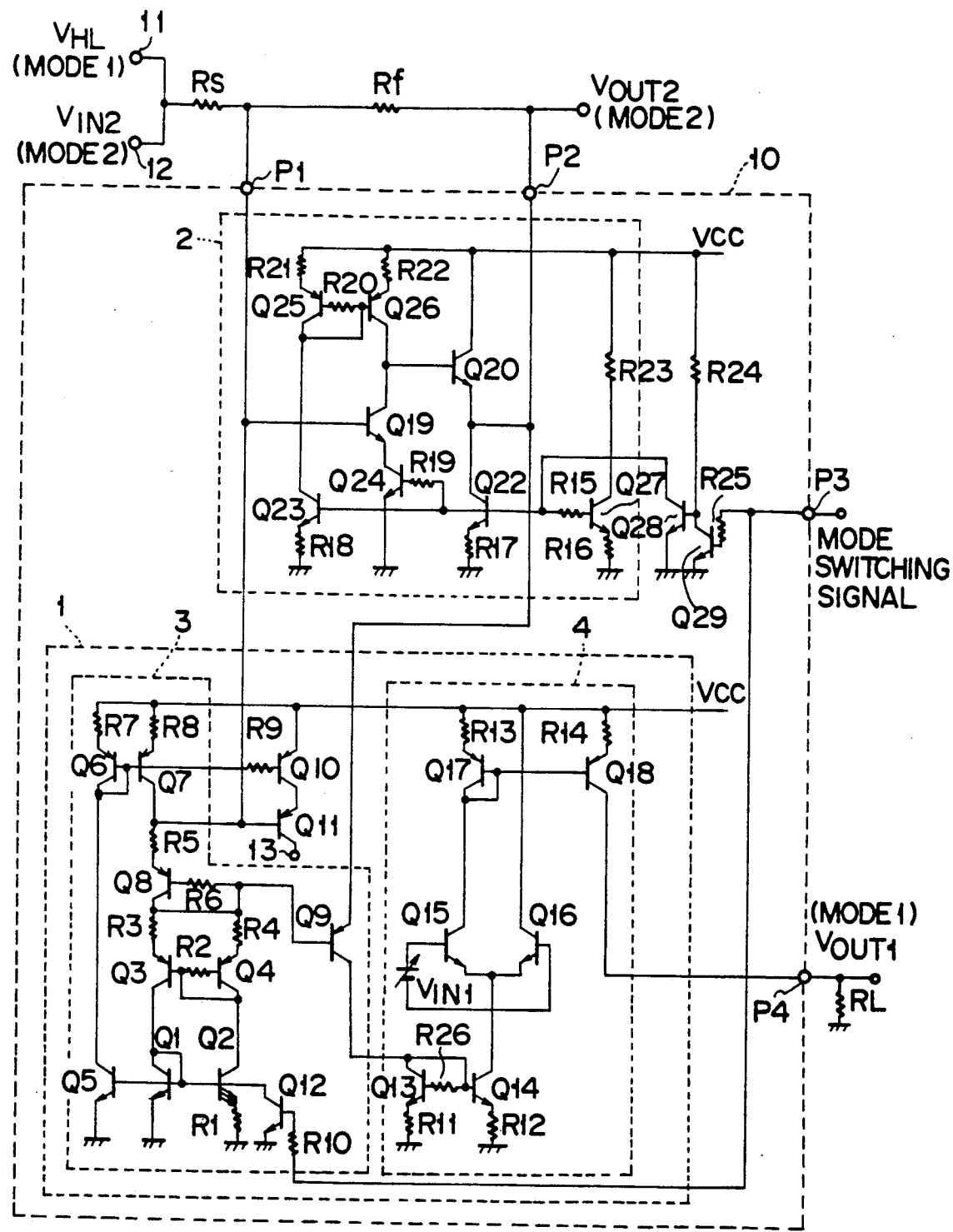
FIG. 5 is a block diagram for illustrating a semiconductor integrated circuit according to a third embodiment of this invention and shows an example of the construction of the integrated circuit in which a single external pin is commonly used by a plurality of circuits.

FIG. 5 shows a semiconductor integrated circuit according to still another embodiment of this invention. In this embodiment, a block construction in which a plurality of functions are provided for a single external pin is shown. The circuit generates an output voltage $V_{OUT1}$ corresponding to an input voltage $V_{IN1}$ in the mode 1, turns ON/OFF a transistor Q11 according to a logic signal supplied to an input terminal 11, and utilizes an ON/OFF current. In the mode 2, it outputs a signal $V_{OUT2}$ obtained by amplifying an input voltage applied to an input terminal 12.

The integrated circuit 10 is constructed to include first to fourth circuits 1 to 4. An externally attached resistor Rf is connected between external pins P1 and P2. An externally attached resistor $R_L$ is connected between an external pin P4 and the ground terminal and acts as a load resistor of the fourth circuit 4. A mode switching signal (which is set at an "L" level in the mode 1 and at an "H" level in the mode 2) for selectively setting the operation mode of the integrated circuit 10 into the mode 1 or mode 2 is supplied to an external pin P3. First and second input terminals 11 and 12 are connected to one end of the external resistor Rf and the external pin P1 via an externally connected resistor $R_S$. A logic signal VHL which is set to the "H" level or high impedance state in the mode 1 and set into a high impedance state in the mode 2 is supplied to the first input terminal 11. An input voltage $V_{IN2}$ which is set into a high impedance state in the mode 1 and becomes valid in the mode 2 is applied to the second input terminal 12.

The external pin P1 serves as an input pin for the logic signal $V_{HL}$ of the first input terminal 11 in the mode 1 and functions in cooperation with the external pin P2 to derive a current flowing in the external resistor Rf by means of the third circuit 3, and in the mode 2, it serves as an input pin for receiving the voltage $V_{IN2}$ from the second input terminal 12. At the external pin P4, a voltage corresponding to the input voltage $V_{IN1}$ input to the fourth circuit 4 appears as a first output voltage $V_{OUT1}$ in the mode 1 and no valid signal appears in the mode 2. The external pin P2 is an output pin, and at the pin, no valid signal appears in the mode 1 and a signal obtained by amplifying the input voltage $V_{IN2}$ input from the second input terminal 12 appears as a second output voltage $V_{OUT2}$ in the mode 2.

The first circuit 1 contains the third and fourth circuits 3 and 4 and is constructed to include NPN transistors Q1, Q2, Q5 and Q12 to Q16, PNP transistors Q3, Q4, Q6 to Q11, Q17 and Q18 and resistors R1 to R14 and R26. That is, the external pin P1 is connected to the base of the transistor Q11, the collector of the transistor Q7 and one end of the resistor 5. The emitter of the transistor Q11 is connected to the collector of the transistor Q10 and the collector thereof is connected to a terminal 13 which is connected to another internal circuit. The emitter of the transistor Q10 is connected to the power source Vcc and the base thereof is connected to one end of the resistor R9. The other end of the resistor R9 is connected to the bases of the transistors Q6 and Q7 and the collector of the transistor Q6. The resistor R7 is connected between the emitter of the transistor Q6 and the power source Vcc and the resistor R8 is connected between the emitter of the transistor Q7 and the power source Vcc. The emitter of the transistor Q8 is connected to the other end of the resistor R5 and the collector thereof is connected to one end of the resistor R3. The base of the transistor Q8 is connected to one end of the resistor R6 and the other end of the resistor R6 is connected to the base of the transistor Q9 and one end of the resistor R4. Oneside ends of the resistors R3 and R4 are commonly connected and the other ends thereof are respectively connected to the emitters of the transistors Q3 and Q4. The resistor R2 is connected between the bases of the transistors Q3 and Q4 and the base of the transistor Q3 is connected to the collector of the transistor Q4. The collectors of the transistors Q3 and Q4 are respectively connected to the collectors of the transistors Q1 and Q2. The bases of the transistors Q1 and Q2 are commonly connected and the base common connection node is connected to the collector of the transistor Q1. The emitter of the transistor Q1 is connected to the ground terminal and the resistor R1 is connected between the emitter of the transistor Q2 and the ground terminal. The base of the transistor Q5 is connected to the bases of the transistors Q1 and Q2 and the collector of the transistor Q12, the collector thereof is connected to the collector of the transistor Q6 and the emitter thereof is connected to the ground terminal. The emitter of the transistor Q9 is connected to the external pin P2 and the collector thereof is connected to the collector of the transistor Q13, the base of the transistor Q14 and one end of the resistor R26. The resistor R10 is connected between the base of the transistor Q12 and the external pin P3 and the emitter of the transistor Q12 is connected to the ground terminal. The other end of the resistor R26 is connected to the base of the transistor Q13 and the resistor R11 is connected between the emitter of the transistor Q13 and the ground terminal. The collector of the transistor Q14 is connected to the emitters of the transistors Q15 and Q16 and the resistor R12 is connected between the emitter thereof and the ground terminal. A differential input signal is supplied from the signal source $V_{IN1}$ to the bases of the transistors Q15 and Q16. The collector of the transistor Q15 is connected to the collector of the transistor Q17 and the bases of the transistors Q17 and Q18. The collector of the transistor Q16 is connected to the power source Vcc. The resistor R13 is connected between the emitter of the transistor Q17 and the power source Vcc. The resistor R14 is connected between the emitter of the transistor Q18 and the power source Vcc and the collector of the transistor Q18 is connected to the external pin P4.

The second circuit 2 is constructed to include NPN transistors Q19, Q20, Q22 to Q24 and Q27 to Q29, PNP transistors Q25 and Q26, and resistors R15 to R25. The external pin P1 is connected to the base of the transistor Q19. The collector of the transistor Q19 is connected to the base of the transistor Q20 and the collector of the transistor Q26, and the emitter thereof is connected to the collector of the transistor Q24. The resistor R22 is connected between the emitter of the transistor Q26 and the power source Vcc, and the base of the transistor Q26 is connected to one end of the resistor R20 and the collector of the transistor Q25. The base of the transistor Q25 is connected to the other end of the resistor R20 and the collector thereof i connected to the collector of the transistor Q23, and the resistor R21 is connected between the emitter of the transistor Q25 and the power source Vcc. The base of the transistor Q23 is connected to one end of the resistor R19, the base of the transistor Q22, one end of the resistor R15 and the collectors of the transistors Q27 and Q28. The resistor R18 is connected between the emitter of the transistor Q23 and the ground terminal. The base of the transistor Q24 is connected to the other end of the resistor R19 and the emitter thereof is connected to the ground terminal. The collector of the transistor Q22 is connected to the emitter of the transistor Q20 and the external pin P2 and the resistor R17 is connected between the emitter thereof and the ground terminal. The collector of the transistor Q20 is connected to the power source Vcc. The base of the transistor Q27 is connected to the other end of the resistor R15, the resistor R23 is connected between the collector thereof and the power source Vcc, and the resistor R16 is connected between the emitter thereof and the ground terminal. The resistor R24 is connected between the base of the transistor Q28 and the power source Vcc, and the emitter of the transistor Q28 is connected to the ground terminal. The collector of the transistor Q29 is connected to the base of the transistor Q28, the emitter thereof is connected to the ground terminal, and the resistor R25 is connected between the base of the transistor Q29 and the external pin P3.

Next, the operation of the circuit of the above construction is explained.

Since the external pin P3 is set at the "L" level in the mode 1, the transistor Q29 in the second circuit 2 and the transistor Q12 in the fourth circuit 4 are set in the OFF state and the transistor Q28 in the second circuit 2 is set in the ON state. Therefore, the second circuit 2 is set in the non-operative state and the first circuit 1 is set in the operative state. The transistors Q1 to Q4 in the third circuit 3 constitute a band gap current source circuit to supply a constant current to the transistors Q5 to Q8 in the third circuit 3. The transistor Q10 in the third circuit 3 is set in the ON state. Assuming that the logic signal $V_{HL}$ input from the first input terminal 11 is at the "H" level, then a current is caused to flow into the external pin P1 via the externally connected resistor $R_S$ and therefore the base potential of the transistor Q11 in the first circuit 1 is set to be higher than (Vcc - 0.7 V), thereby turning off the transistor Q11. In contrast, when the logic signal $V_{HL}$ input from the first input terminal 11 is at the high impedance state, then a current is supplied the base of transistor Q11 flow through the resistor R5 and the externally connected resistor Rf, whereby transistor Q11 is turned on, and the same current flow to transistor Q10.

That is, the transistor Q11 is turned off when the logic signal $V_{HL}$ input in the mode 1 is at the "H" level, and is turned on when the signal $V_{HL}$ is in the high impedance state. In the mode 1, the pin P4 applies a voltage corresponding to the input voltage $V_{IN1}$ (i.e., the first output voltage $V_{OUT1}$), irrespective of the level of the logic signal $V_{HL}$. Hence, no valid signal is supplies from the pin P2.

In the mode 2, since the potential of the pin P3 is at the "H" level, the transistors Q29 and Q12 are set in the ON state and the transistor Q28 is set in the OFF state so that the first circuit 1 will be set in the non-operative state and the second circuit 2 will be set in the operative state. In this case, since the transistor Q24 is set in the ON state, the transistor Q19 functions as a grounded-emitter amplifier circuit and the second circuit 2 functions as an inverting type amplifier circuit having a gain of $Rf/R_S$. In the mode 2, no valid signal appears on the external pin P4 and a signal obtained by amplifying an input voltage $V_{IN2}$ input from the second input terminal 12 appears as a second output voltage $V_{OUT2}$ on the external pin P2.

A current I created in the mode 1 by the band gap current source circuit formed of the transistors Q1 to Q4 can be expressed by the following equation.

$$I = (V_T/R1) \cdot \ln N \quad (5)$$

where N indicates the ratio of the emitter area of the transistor Q2 to that of the transistor Q1.

Since the current I is equal to the operation current of the transistors Q1 to Q4, the collector current Ic(Q8) of the transistor Q8 can be expressed by the following equation.

$$Ic(Q8) = (2 \cdot V_T/R1) \cdot \ln N \quad (6)$$

Since the transistors Q8 and Q9 in the third circuit 3 constitutes a current mirror circuit, the collector current Ic(Q9) of the transistor Q9 is determined by the ratio of the resistances of the resistors R5 and Rf if the constants are so determined as to set a voltage $V_{R5}$ generated across the resistor R5 sufficiently higher than $V_T$(26 mV at the normal temperature) and the collector current Ic(Q9) can be expressed by the following equation.

$$\begin{aligned} Ic(Q9) &= (R5/Rf) \cdot Ic(Q8) \\ &= (2 \cdot V_T \cdot \ln N) \cdot (R5/R1) \cdot (1/Rf) \end{aligned} \quad (7)$$

At this time, a voltage $V_{Rf}$ expressed by the following equation is generated across the resistor Rf.

$$V_{Rf} = (2 \cdot V_T \cdot \ln N) \cdot (R5/R1) \quad (8)$$

As can be seen from the equation (8), the voltage generated across the resistor Rf will not be influenced by variation in the resistances of the resistors R5 and R1 since the resistors R5 and R1 are resistors provided inside the chip and the ratio of the resistances of the resistors R5 and R1 may be kept substantially unchanged even when the resistances thereof have varied. Further, the temperature characteristic thereof is set equal to that of the thermal voltage $V_T$.

The fourth circuit 4 functions to supply the collector current Ic(Q9) of the transistor Q9 derived from the third circuit 3 to the load resistor $R_L$, but in this example, it serves as an amplifier circuit for outputting a current corresponding to the voltage $V_{IN1}$. Assuming that the collector currents of the transistors Q13 and Q14 are equal to each other, the first output voltage $V_{OUT1}$ appearing on the external pin P4 can be expressed as follows.

$$\begin{aligned} V_{OUT1} &= \{(R_L \cdot Ic(Q14)/(4 \cdot V_T)\} \cdot V_{IN1} \quad (9) \\ &= \{(1/2) \cdot (R5/R1) \cdot (R_L/Rf) \cdot \ln N\} \cdot V_{IN1} \quad (9)' \end{aligned}$$

In the equation (9), Ic(Q14) is a collector current of the transistor Q14 and is equal to Ic(Q9). In the equation (9)', since the resistors R5 and R1 are formed on the same chip and variation in and the temperature coefficients of the resistances of the resistors are substantially equal, the first output voltage $V_{OUT1}$ will not be influenced by variation in and the temperature coefficients of the resistances of the resistors formed inside the chip. Further, the resistors $R_L$ and Rf are externally attached to the chip, but variation in the resistances thereof is suppressed to a sufficiently small value for practical application and the temperature coefficients thereof are set as small as negligible so that influence by the externally attached resistors can be neglected. Thus, it is understood that the first output voltage $V_{OUT1}$ can be free from the influence by variation in and the temperature coefficients of the resistances of the externally attached resistors.

As described above, in a case where the transfer characteristic (which is $V_{OUT1}/V_{IN1}$ and can be obtained by dividing the equation (9) by $V_{IN1}$) varies in inverse proportion to $V_T$, the transfer characteristic can be made independent from the temperature variation if a voltage generated across the resistor Rf is set to vary in proportion to the thermal voltage $V_T$.

With the circuit construction shown in FIG. 5, a voltage generated across the externally connected resistor Rf which is connected to the second circuit 2 and the third circuit 3 and whose resistance is used as a reference of a current created by the third circuit 3 is set to a constant voltage which varies in proportion to the thermal voltage $V_T$. However, the temperature coefficient is required to be set to zero for some applications and an example of this case is shown in FIG. 6.

Figure 6:
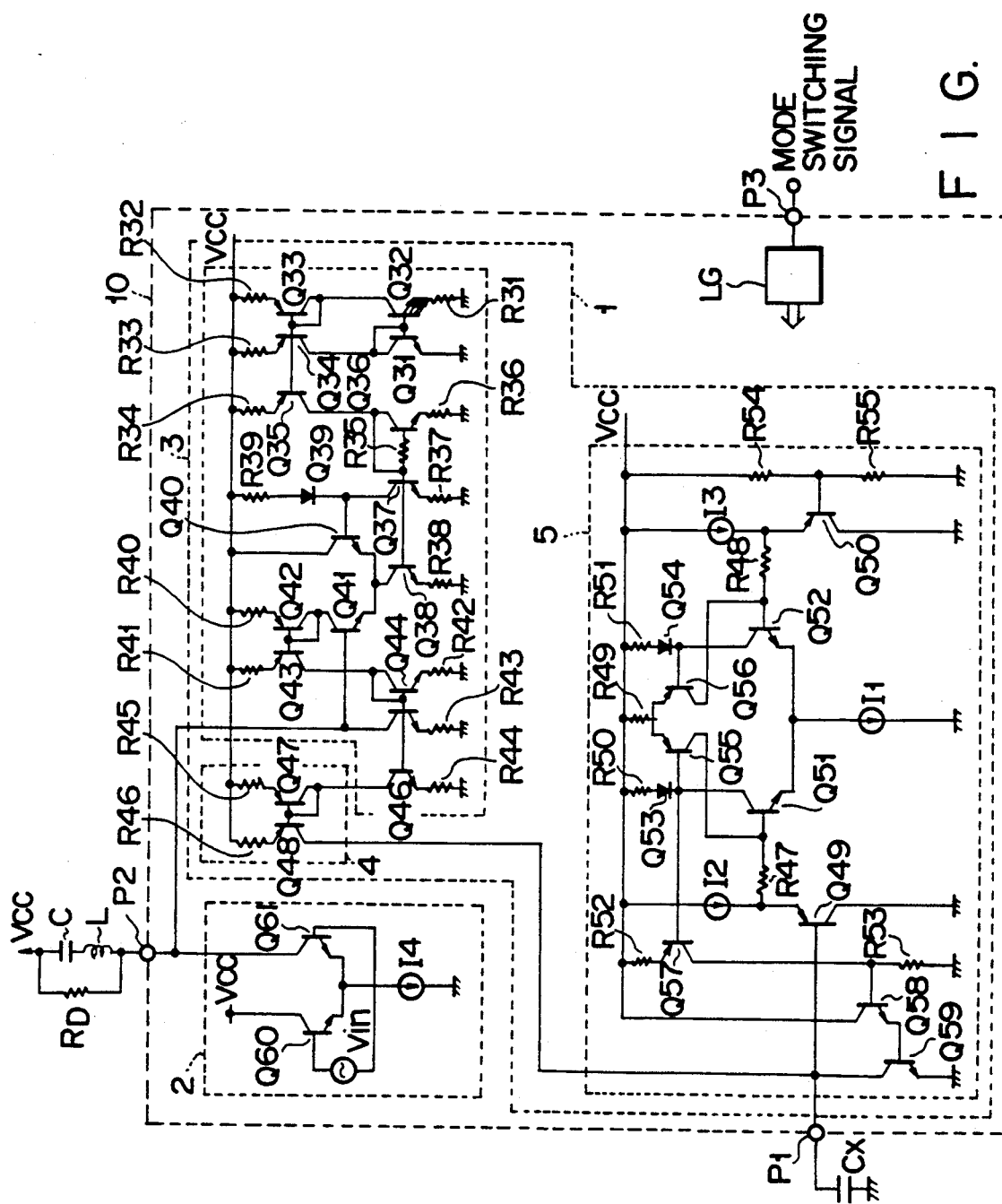
FIG. 6 is a block diagram for illustrating a semiconductor integrated circuit according to a fourth embodiment of this invention and shows a circuit for outputting a sawtooth wave in a first mode and exhibiting a trap characteristic in a second mode as an example of the integrated circuit having a zero temperature coefficient.

An integrated circuit shown in FIG. 6 is constructed to include first to fourth transistors 1 to 4. An externally attached capacitor $C_X$ is connected as a load of the fourth circuit 4 between the external pin P4 and the ground terminal. The capacitor C, inductor L and damping resistor $R_D$ are connected between the external pin P2 and the power source and are combined with the second circuit 2 to constitute a trap circuit. The third circuit 3 serves to derive a current flowing in the resistor $R_D$ externally attached to the second circuit 2. The fourth circuit 4 supplies a current derived by the third circuit 3 to the capacitor $C_X$. The fifth circuit 5 is combined with the capacitor $C_X$ to constitute a sawtooth oscillator. The logic circuit LG has a control function to selectively set the operation mode of the integrated circuit to the mode 1 or mode 2 according to a mode switching signal (which is set at the "L" level in the mode 1 and at the "H" level in the mode 2) input via the external pin P3.

The first circuit 1 is constituted to include the third, fourth and fifth circuits 3, 4 and 5. The second circuit 2 is constituted by NPN transistors Q60 and Q61, signal source Vin, and current source I4. The emitters of the transistors Q60 and Q61 are commonly connected, the collector of the transistor Q60 is connected to the power source Vcc, and the collector of the transistor Q61 is connected to the external pin P2. The current source I4 is connected between the ground terminal and the emitter common connection node of the transistors Q60 and Q61. The bases of the transistors Q60 and Q61 are supplied with differential input signals from the signal source Vin.

The third circuit 3 is constituted to include NPN transistors Q31, Q32, Q36 to Q41 and Q44 to Q46, PNP transistors Q33 to Q35, Q42 and Q43, and resistors R31 to R44. In this case, the transistor Q39 is connected in a diode configuration and is represented by a diode in FIG. 6. The resistors R32 and R33 are respectively connected between the emitters of the transistors Q33, Q34 and the power source Vcc. The bases of the transistors Q33 and Q34 are commonly connected and the base common connection node is connected to the collector of the transistor Q33 and the base of the transistor Q35. The collectors of the transistors Q33 and Q32 are connected together and the collectors of the transistors Q34 and Q31 are connected together. The bases of the transistors Q31 and Q32 are commonly connected and the base common connection node thereof is connected to the collector of the transistor Q31. The emitter of the transistor Q31 is connected to the ground terminal and the resistor R31 is connected between the emitter of the transistor Q32 and the ground terminal. The resistor R34 is connected between the emitter of the transistor Q35 and the power source Vcc, and the collector of the transistor Q35 is connected to the collector of the transistor Q36, the bases of the transistors Q37 and Q38 and one end of the resistor R35. The base of the transistor Q35 is connected to the other end of the resistor R35 and the resistor R36 is connected between the emitter thereof and the ground terminal. The diode (diode-connected transistor) Q39 and the resistor R3 are series-connected between the collector of the transistor Q37 and the power source Vcc and the resistor R37 is connected between the emitter thereof and the ground terminal. The collector of the transistor Q40 is connected to the power source Vcc, the base thereof is connected to the collector of the transistor Q37 and the emitter thereof is connected to the emitter of the transistor Q41. The collector of the transistor Q38 is connected to the emitters of the transistors Q40 and Q41 and the resistor R38 is connected between the emitter of the transistor Q38 and the ground terminal. The collector of the transistor Q41 is connected to the collector of the transistor Q42 and the bases of the transistors Q42 and Q43, and the base thereof is connected to the external pin P2 and the collector of the transistor Q45. The resistor R40 is connected between the emitter of the transistor Q42 and the power source Vcc and the resistor R41 is connected between the emitter of the transistor Q43 and the power source Vcc. The collector of the transistor Q43 is connected to the collector of the transistor Q44 and the bases of the transistors Q44 to Q46. The resistor R42 is connected between the emitter of the transistor Q44 and the ground terminal, the resistor R43 is connected between the emitter of the transistor Q45 and the ground terminal and the resistor R44 is connected between the emitter of the transistor Q46 and the ground terminal. The collector of the transistor Q46 is connected to the fourth circuit 4.

The fourth circuit 4 is constructed to include transistors Q47 and Q48 and resistors R45 and R46. The resistor R45 is connected between the emitter of the transistor Q47 and the power source Vcc, the base thereof is connected to the base of the transistor Q48, and the collector thereof is connected to the base common connection node of the transistors Q47 and Q4 and the collector of the transistor Q46. The resistor R46 is connected between the emitter of the transistor Q48 and the power source Vcc and the collector of the transistor Q48 is connected to the external pin P1.

The fifth circuit 5 includes NPN transistors Q51, Q52, Q58 and Q59, PNP transistors Q49, Q50 and Q53 to Q57 and resistors R47 to R55. The external pin P1 is connected to the base of the transistor Q49 and the collector of the transistor Q59. A current source I2 is connected between the emitter of the transistor Q49 and the power source Vcc and the collector of the transistor Q49 is connected to the ground terminal. The resistors R54 and R55 are series-connected between the power source Vcc and the ground terminal. The base of the transistor Q50 is connected to a connection node between the resistors R54 and R55, a current source I3 is connected between the emitter thereof and the power source Vcc, and the collector thereof is connected to the ground terminal. The base of the transistor Q51 is connected to the emitter of the transistor Q49 via the resistor R47 and the base of the transistor Q52 is connected to the emitter of the transistor Q50 via the resistor R48. The emitters of the transistors Q51 and Q52 are commonly connected and a current source I1 is connected between the emitter common connection node thereof and the ground terminal. The diode (which is a diode-connected transistor) Q53 and the resistor R50 are series-connected between the collector of the transistor Q51 and the power source Vcc and the diode (which is a diode-connected transistor) Q54 and the resistor R51 are series-connected between the collector of the transistor Q52 and the power source Vcc. The emitters of the transistors Q55 and Q56 are commonly connected and the resistor R49 is connected between the emitter common connection node and the power source Vcc. The base of the transistor Q55 is connected to the collector of the transistor Q51 and the base of the transistor Q57 and the collector thereof is connected to the base of the transistor Q51. The base of the transistor Q56 is connected to the collector of the transistor Q52 and the collector thereof is connected to the base of the transistor Q52. The resistor R52 is connected between the emitter of the transistor Q57 and the power source Vcc and the collector of the transistor Q57 is connected to the base of the transistor Q58. The collector of the transistor Q58 is connected to the power source Vcc, the resistor R53 is connected between the base thereof and the ground terminal and the emitter thereof is connected to the base of the transistor Q59. The emitter of the transistor Q59 is connected to the ground terminal.

In the circuit of FIG. 6, the first circuit 1 is operated in the mode 1 and a sawtooth wave appears on the external pin P1, and the second circuit 2 is operated in the mode 2 and a trap characteristic appears on the pin P2.

First, the operation in the mode 1 is explained. The transistors Q31 to Q34 constitute a band gap current source circuit which supplies a band gap current to the transistors Q35 to Q38. The band gap current is also supplied to the resistor R39 and the diode-connected transistor Q39, but in this case, the base potential $V_B(Q40)$ of the transistor Q40 can be made independent from temperature variation by setting the voltage drop in the resistor R39 and the transistor Q39, or a difference between the potential of the power source Vcc and the base potential $V_B(Q40)$ of the transistor Q40 to a band gap voltage $V_{BG}$ (approx. 1.2 V). Since the transistors Q40 to Q45 constitute a feedback amplifier circuit, the base potential of the transistor Q41 or the potential of the external pin P2 becomes equal to the base potential $V_B(Q40)$ of the transistor Q40. That is, a voltage applied across the resistor $R_D$ has no temperature dependency. In this case, the transistors Q44 to Q46 constitute a current mirror circuit, currents flowing in the transistors Q44 to Q46 are all equal (assuming that the resistances of the resistors R42, R43 and R44 are equal to each other) and the collector current of the transistor Q46 becomes equal to a current flowing in the resistor $R_D$. Since the current is inverted by the current mirror circuit constituted by the transistors Q47 and Q48, the collector current $I_C(Q48)$ of the transistor Q48 can be expressed by the following equation if the resistances of the resistors R45 and R46 are equal to each other.

$$I_C(Q48) = (V_{R9} + V_F(Q39))/R_D = V_{BG}/R_D \quad (10)$$

where the band gap voltage $V_{BG}$ is approx. 1.2 V, $V_{R39}$ indicates a voltage drop in the resistor R39 and $V_F(Q39)$ of the transistor Q39 indicates a voltage drop in the transistor Q39.

The transistors Q49 to Q56 in the fifth circuit constitute a hysteresis circuit, and if the charge on the capacitor $C_X$ is 0 in the initial condition, that is, if the potential of the external pin P1 is 0 V, then the transistor Q51 is set in the OFF state, the transistor Q52 is set in the ON state and the transistors Q58 and Q59 are set in the OFF state. The capacitor $C_X$ is connected to the collector of the transistor Q48 and the collector current $I_C(Q48)$ of the transistor Q48 is caused to flow into the capacitor $C_X$ as a charging current. Therefore, the potential $V_{CX}$ of the external pin P1 increases with time t as can be expressed by the following equation.

$$V_{CX} = (I_C(Q48)/C_X) \cdot t \quad (11)$$

When the potential $V_{CX}$ of the external pin P1 becomes equal to a voltage obtained by adding the hysteresis voltage $V_{HIS}$ to the base potential $V_B(Q50)$ of the transistor Q50, the transistor Q51 is turned on and the transistor Q52 is turned off. As a result, the transistors Q58 and Q59 are turned on and the charge on the capacitor $C_X$ is instantaneously discharged to 0 by means of the transistor Q59. Then, the transistors Q51, Q58 and Q59 are turned off again and the transistor Q52 is turned on so as to start to charge the capacitor $C_X$. This operation is repeatedly effected to sustain the sawtooth oscillation. Since the time T of one period is equal to the time that the potential $V_{CX}$ of the external pin P1 takes to become equal to the above-described voltage $(V_B(Q50) + V_{HIS})$, T may be determined to satisfy the following equation.

$$(I_C(Q48)/C_X) \cdot T = V_B(Q50) + V_{HIS} \quad (12)$$

The following equation can be derived by combining the equations (10) and (12).

$$T = (R54/(R54 + R55)) \cdot (Vcc/V_{BG}) \cdot (R_D \cdot C_X) \quad (13)$$

where $V_B(Q50)$ is set to be sufficiently higher than $V_{HIS}$.

As can be clearly understood from the equation (13), since the resistors R54 and R55 are formed inside the integrated circuit 10, the ratio of the resistances thereof may be kept substantially constant even if the resistances thereof are changed and the temperature characteristics thereof may be considered to be equal to each other. Further, since the temperature coefficients gap voltage $V_{BG}$ may be considered to be 0, the period T of the sawtooth wave may be proportional to the product of the resistance of the resistor $R_D$ and the capacitance of the capacitor $C_X$ and will not be influenced by variations or temperature changes of other factors.

Additional advantages and modifications will readily occur to those skilled in the art. Therefore, the invention in its broader aspects is not limited to the specific details, and representative devices, shown and described herein. Accordingly, various modifications may be without departing from the spirit or scope of the general inventive concept as defined by the appended claims and their equivalents.

As described above, according to this invention, a semiconductor integrated circuit can be obtained in which variation in and influence by temperature change on the gain of an amplifier circuit or the like which varies in proportion to the resistance of an externally attached load resistor can be effectively suppressed without increasing the number of external pins and externally attached resistors.

What is claimed is:
1. A semiconductor integrated circuit comprising:
   first circuit means which is set into an operative state in a first mode and into a non-operative state in a second mode;
   an impedance circuit included in said first circuit means and externally connected to a ship;
   second circuit means set into an operative state in the second mode and into a non-operative state in the first mode;
   resistor means included in said second circuit means and externally connected to said chip, wherein a transfer characteristic of said first circuit means depends on a ratio of an impedance of said resistor means to an impedance of said impedance circuit; and
   third circuit means contained in said first circuit means, for keeping a DC voltage applied across said resistor means constant and deriving a direct current flowing in said resistor means in the first mode irrespective of the presence or absence and the magnitude of a voltage applied to one end of said resistor means.

2. A semiconductor integrated circuit according to claim 1, wherein said first circuit means further includes fourth circuit means for supplying a current derived by means of said third circuit means in the first mode to the impedance circuit included in said first circuit means.

3. A semiconductor integrated circuit according to claim 2, wherein said third circuit means includes means for maintaining a voltage across said resistor means included in said second circuit means to a constant voltage which is proportional to a thermal voltage $V_T$.

4. A semiconductor integrated circuit according to claim 2, wherein said third circuit means includes means for maintaining a voltage across said resistor means included in said second circuit means at a constant voltage whose temperature coefficient is substantially 0.

5. A semiconductor integrated circuit according to claim 1, wherein said first circuit means serves as a recording-side amplifier circuit, said second circuit means serves as a reproducing-side amplifier circuit, the first mode is a recording mode, the second mode is a reproducing mode, said resistor means is a resistor used in said reproducing-side amplifier circuit, and the semiconductor integrated circuit is used as a magnetic recording and reproducing device.

6. A semiconductor integrated circuit according to claim 1, wherein said first circuit means serves as a reproducing-side amplifier circuit, said second circuit means serves as a recording-side amplifier circuit, the first mode is a reproducing mode, the second mode is a recording mode, said resistor means is a resistor used in said recording-side amplifier circuit, and the semiconductor integrated circuit is used as a magnetic recording and reproducing device.

7. A semiconductor integrated circuit according to claim 6, wherein an external pin which is connected to said first circuit means and one end of said resistor means is used as a logic signal input pin for selectively setting a metal/normal mode in the reproducing mode and the semiconductor integrated circuit is used as a compact cassette magnetic recording and reproducing device.

8. A semiconductor integrated circuit according to claim 1, wherein said first circuit means serves as an AM tuner circuit, said second circuit means serves as an FM tuner circuit, the first mode is an AM reception mode, the second mode is an FM reception mode, and an external pin which is connected to said first circuit means and one end of said resistor means is used as a logic signal input pin for selectively setting a stereo/forced monoral mode in the FM reception mode, and the semiconductor integrated circuit is used as a multiplexer built-in type FM/AM tuner.

* * * * *